(12) United States Patent
Kokame

(10) Patent No.: US 10,741,790 B2
(45) Date of Patent: Aug. 11, 2020

(54) DISPLAY DEVICE

(71) Applicant: Japan Display Inc., Tokyo (JP)

(72) Inventor: Hiraaki Kokame, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/582,283

(22) Filed: Sep. 25, 2019

(65) Prior Publication Data

US 2020/0020882 A1 Jan. 16, 2020

Related U.S. Application Data

(63) Continuation of application No. 16/296,375, filed on Mar. 8, 2019, now Pat. No. 10,461,277, which is a continuation of application No. 16/178,936, filed on Nov. 2, 2018, now Pat. No. 10,270,060, which is a continuation of application No. 15/608,468, filed on May 30, 2017, now Pat. No. 10,147,905.

(30) Foreign Application Priority Data

Jul. 22, 2016 (JP) ................................. 2016-144198

(51) Int. Cl.
*H01L 51/52* (2006.01)
*H01L 27/32* (2006.01)
*H01L 51/00* (2006.01)
*H01L 51/56* (2006.01)

(52) U.S. Cl.
CPC .......... *H01L 51/5253* (2013.01); *H01L 27/32* (2013.01); *H01L 51/0097* (2013.01); *H01L 51/56* (2013.01); *H01L 2251/5338* (2013.01); *Y02E 10/549* (2013.01)

(58) Field of Classification Search
CPC ............. H01L 2251/5338; H01L 27/32; H01L 51/0097; H01L 51/5253; H01L 51/56
See application file for complete search history.

(56) References Cited

U.S. PATENT DOCUMENTS 9,159,837 B2 * 10/2015 Yamazaki ........... H01L 29/7869
9,818,976 B2 * 11/2017 Poon ................... H01L 51/5253
(Continued)

FOREIGN PATENT DOCUMENTS

| JP | 2010-027561 A | 2/2010 |
| JP | 2010-244697 A | 10/2010 |
| JP | 2017-173508 A | 9/2017 |

OTHER PUBLICATIONS

Japanese Office Action dated Feb. 18, 2020 for the corresponding Japanese application No. 2016-144198, with partial English machine translation retrieved from the EPO Global Dossier.

*Primary Examiner* — Earl N Taylor
(74) *Attorney, Agent, or Firm* — Michael Best & Friedrich LLP

(57) ABSTRACT

A display device according to the present invention includes a display region arranged with a plurality of pixels, and a sealing layer covering the display region, wherein the sealing layer includes an insulation layer having a density pattern, the density pattern is a pattern including a low density region and a high density region, the low density region has the insulation layer with a lower density than an average density within the display region of the insulation layer, and the high density region has the insulation layer with a higher density than an average density within the display region of the insulation layer.

7 Claims, 10 Drawing Sheets

(56) References Cited

U.S. PATENT DOCUMENTS

| | | | |
|---|---|---|---|
| 10,147,905 B2* | 12/2018 | Kokame | H01L 51/5253 |
| 2002/0018161 A1* | 2/2002 | Yamanaka | G02F 1/133553 |
| | | | 349/112 |
| 2010/0019654 A1 | 1/2010 | Hayashi | |
| 2011/0234088 A1* | 9/2011 | Abe | G02B 5/0215 |
| | | | 313/504 |
| 2012/0062469 A1* | 3/2012 | Guard | G06F 3/044 |
| | | | 345/173 |
| 2013/0200378 A1 | 8/2013 | Park et al. | |
| 2014/0003086 A1 | 1/2014 | Schaffer et al. | |
| 2014/0021457 A1* | 1/2014 | Ukeda | H01L 29/511 |
| | | | 257/40 |
| 2014/0071653 A1* | 3/2014 | Thompson | G02B 6/0055 |
| | | | 362/19 |
| 2014/0152174 A1* | 6/2014 | Wang | H01L 51/5253 |
| | | | 313/511 |
| 2014/0254111 A1* | 9/2014 | Yamazaki | H01L 27/3276 |
| | | | 361/749 |
| 2015/0102318 A1 | 4/2015 | Lee | |
| 2015/0102326 A1 | 4/2015 | An | |
| 2015/0108453 A1* | 4/2015 | Oh | H01L 51/524 |
| | | | 257/40 |
| 2015/0179978 A1* | 6/2015 | Sato | H01L 51/5209 |
| | | | 257/40 |
| 2015/0330597 A2* | 11/2015 | Schaffer | B82Y 30/00 |
| | | | 362/603 |
| 2015/0333293 A1* | 11/2015 | Poon | H01L 51/5253 |
| | | | 257/40 |
| 2016/0013445 A1* | 1/2016 | Isaji | H01L 51/56 |
| | | | 257/40 |
| 2016/0079329 A1* | 3/2016 | Lee | H01L 27/3244 |
| | | | 257/40 |
| 2016/0141551 A1* | 5/2016 | Seo | H01L 51/5253 |
| | | | 257/40 |
| 2016/0218320 A1* | 7/2016 | Chen | H01L 51/5246 |
| 2016/0226021 A1* | 8/2016 | Lee | H01L 51/5237 |
| 2017/0141168 A1* | 5/2017 | Choi | H01L 27/32 |
| 2017/0279073 A1* | 9/2017 | Nagata | H01L 51/5253 |
| 2017/0288063 A1* | 10/2017 | Yamazaki | H01L 29/513 |
| 2017/0294456 A1* | 10/2017 | Lee | H01L 21/02595 |
| 2017/0358688 A1* | 12/2017 | Lee | G06Q 20/227 |
| 2018/0026229 A1* | 1/2018 | Kokame | C22B 59/00 |
| 2018/0233702 A1 | 8/2018 | Chen | |
| 2019/0074482 A1* | 3/2019 | Kokame | H01L 51/56 |

* cited by examiner

DISPLAY DEVICE

CROSS REFERENCE TO RELATED APPLICATIONS

This application is a continuation of U.S. patent application Ser. No. 16/296,375, filed on Mar. 8, 2019, which, in turn, is a continuation of U.S. patent application Ser. No. 16/178,936 (now U.S. Pat. No. 10,270,060), filed on Nov. 2, 2018, which, in turn, is a continuation of U.S. patent application Ser. No. 15/608,468 (now U.S. Pat. No. 10,147,905), filed on May 30, 2017. Further, this application is based upon and claims the benefit of priority from the prior Japanese Patent Application No. 2016-144198, filed on Jul. 22, 2016, the entire contents of which are incorporated herein by reference.

FIELD

The present invention is related to a display device and a method of manufacturing the display device. Specifically, the present invention is related to an organic electroluminescence (referred to herein as organic EL) display device and a method of manufacturing the display device.

BACKGROUND

An organic EL display device is arranged with a light emitting element in each pixel and an image is displayed by individually controlling the emitted light. A light emitting element includes a structure in which a layer (referred to herein as [light emitting layer]) including an organic EL material is sandwiched between a pair of anodes, one distinguished as an anode and the other as a cathode. When electrons are injected to the light emitting layer from the cathode and holes are injected from the anode, the electrons and hole recombine. Light emitting molecules within the light emitting layer are excited by surplus energy discharged thereby and light is subsequently emitted by de-excitation.

In an organic EL display device, the anode of each light emitting element is arranged as a pixel electrode for each pixel and the cathode is arranged as a common electrode across a plurality of pixels and applied with a common potential. The organic EL display device controls light emission of a pixel by applying the potential of a pixel electrode to each pixel with respect to the potential of the common electrode. Furthermore, the cathode may be arranged in each pixel and in this case it is not necessary that a common potential is applied to all pixels.

However, a light emitting layer of an organic EL display device is easily degraded by the infiltration of water and a problem exists whereby a non-lighting region called a dark spot is produced. In order to solve such a problem, a sealing layer for preventing the infiltration of water is arranged in many organic EL display devices.

For example, an organic light emitting display device is disclosed in Japanese Laid Open Patent Publication No. 2010-027561 arranged with a substrate, a display part formed above the substrate, a sealing film covering the display part and a non-light emitting region of the periphery side of the display part and the density and thickness of which increases from the center part to an edge part. In this way, the lifetime of an organic light emitting display device is increased by preventing water or oxygen from permeating in a side surface direction.

In recent years, flexible display devices are actively being developed in which display regions can be bent. While a sealing layer arranged in a flexible display device has high barrier properties at high densities, cracks may easily occur when a sealing layer is bent. Since cracks which occur in a sealing layer can become a water infiltration path, reliability of a display device drops.

SUMMARY

A display device according to one embodiment of the present invention includes a display region arranged with a plurality of pixels, and a sealing layer covering the display region, wherein the sealing layer includes an insulation layer having a density pattern, the density pattern is a pattern including a low density region and a high density region, the low density region has the insulation layer with a lower density than an average density within the display region of the insulation layer, and the high density region has the insulation layer with a higher density than an average density within the display region of the insulation layer.

A manufacturing method of a display device according to one embodiment of the present invention includes preparing an array substrate having flexibility and arranged with a plurality of pixels in a display region, and forming an inorganic insulation layer covering the plurality of pixels using a roll coater, wherein the inorganic insulation layer is formed so that a density pattern is included having a low density region and a high density region, the low density region has the inorganic insulation layer with a lower density than an average density within the display region of the inorganic insulation layer, and the high density region has the inorganic insulation layer with a higher density than an average density within the display region of the inorganic insulation layer.

DESCRIPTION OF EMBODIMENTS

Figure 1:
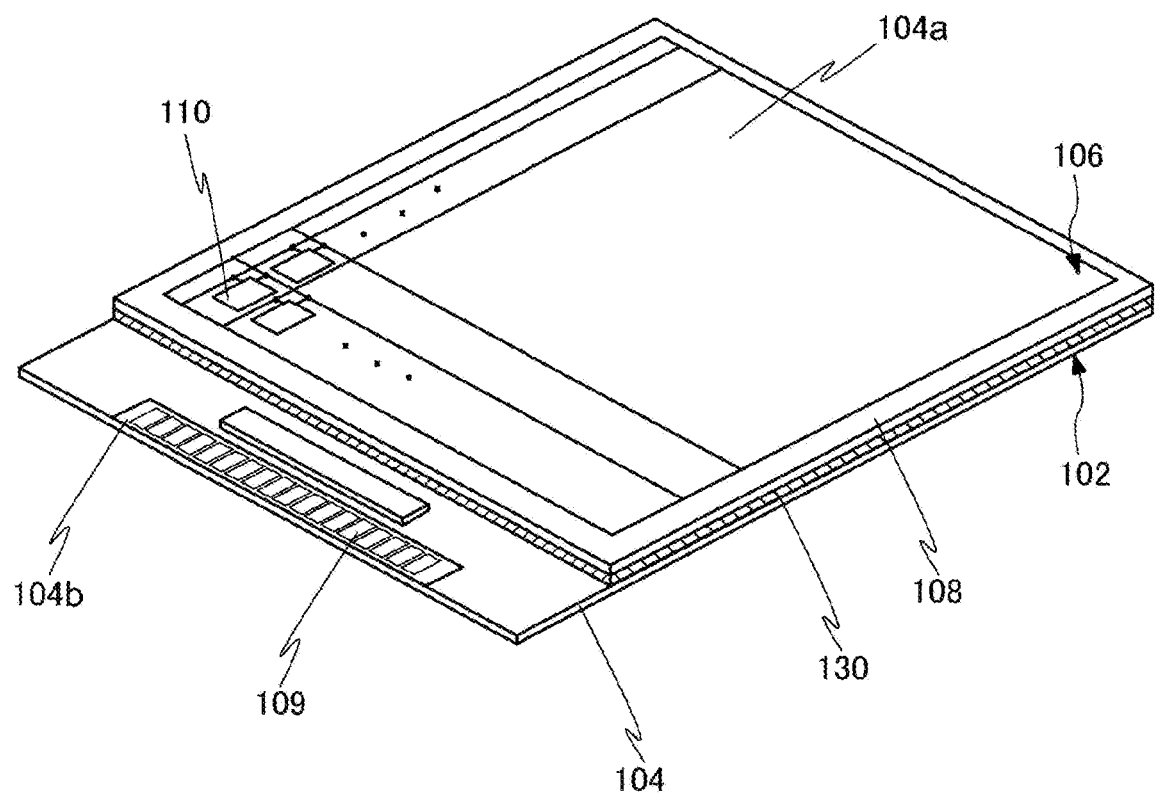
FIG. 1 is perspective view diagram for explaining an approximate structure of a display device related to one embodiment of the present invention.

A display device related to a number of embodiments of the present invention is explained in detail below while referring to the diagrams. However, the display device of the present invention should not be limited to the embodiments below and it is possible to perform the present invention using various modifications. In all of the embodiments, the same reference symbols are attached to similar elements. In addition, the dimension ratios in the drawings may be different from actual ratios and parts of the structure may be omitted from the drawings.

First Embodiment

[External Structure]

FIG. 1 is perspective view diagram for explaining an external structure of a display device 100 related to the present embodiment. The external structure of the display device 100 related to the present embodiment is explained using FIG. 1.

The display device 100 related to the present embodiment includes an array substrate 102, an opposing substrate 106 and a plurality of connection terminals 109.

The array substrate 102 includes at least a first substrate 104 and a plurality of pixels 110.

The first substrate 104 has flexibility. Although a specific material for the substrate having flexibility is described herein, a resin material is used. A display region 104a and a terminal region 104b are arranged above the first substrate 104.

The plurality of pixels 110 is arranged within the display region 104a of the first substrate 104. In the present embodiment, the plurality of pixels 110 is arranged in a matrix. Although not shown in FIG. 1, each of the plurality of pixels 110 is formed from a pixel circuit including at least a selection transistor, a drive transistor and a light emitting element.

The opposing substrate 106 includes at least a second substrate 108.

The second substrate 108 has flexibility. It is possible to use the same substrate as the first substrate 104 as a substrate having flexibility. The second substrate 108 is arranged opposing the first substrate 104 on an upper surface of the display region 104a. The second substrate 108 is fixed to the first substrate 104 by a sealing member 130 which encloses the display region 104a. The display region 104a arranged in the first substrate 104 is sealed by the second substrate 108 and sealing member 130 so that it is not exposed to the air. By adopting such a sealing structure, degradation of a light emitting element in each of the plurality of pixels 110 is suppressed.

The opposing substrate 106 may further include a color filter, a light blocking layer, a polarization plate and a phase plate and the like.

A color filter is arranged at a position opposing each of the plurality of pixels 110. A light blocking layer (also called a black matrix) is arranged at a position which demarcates each of the plurality of pixels 110.

A polarization plate and phase plate cover the plurality of pixels 110 and are arranged on the opposing substrate 106 side. The polarization plate and phase plate are arranged in order to suppress degradation in visibility due to external light which enters the display device 100 being reflected by a pixel electrode.

The plurality of connection terminals 109 is arranged within the terminal region 104b. A plurality of terminal regions 104b is arranged on one end part of the first substrate 104 and the outer side of the second substrate 108. A wiring substrate (not shown in the diagram) which connects devices which output an image signal or a power source with the display device 100 is arranged in the plurality of connection terminals 109. A connection point between the wiring substrate and the plurality of connection terminals 109 is exposed to the exterior.

[Detailed Structure]

Figure 2A:
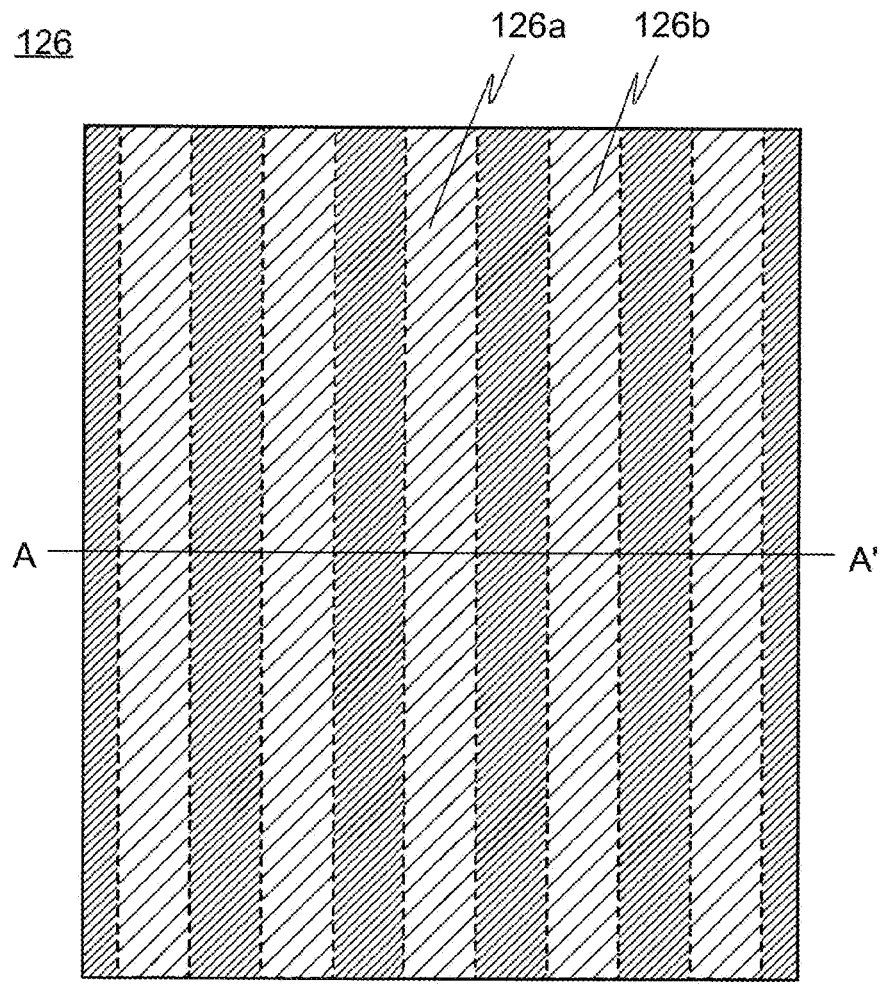
FIG. 2A is a planar view diagram and a cross-sectional diagram for explaining a structure of a display device related to one embodiment of the present invention.
Figure 2A:
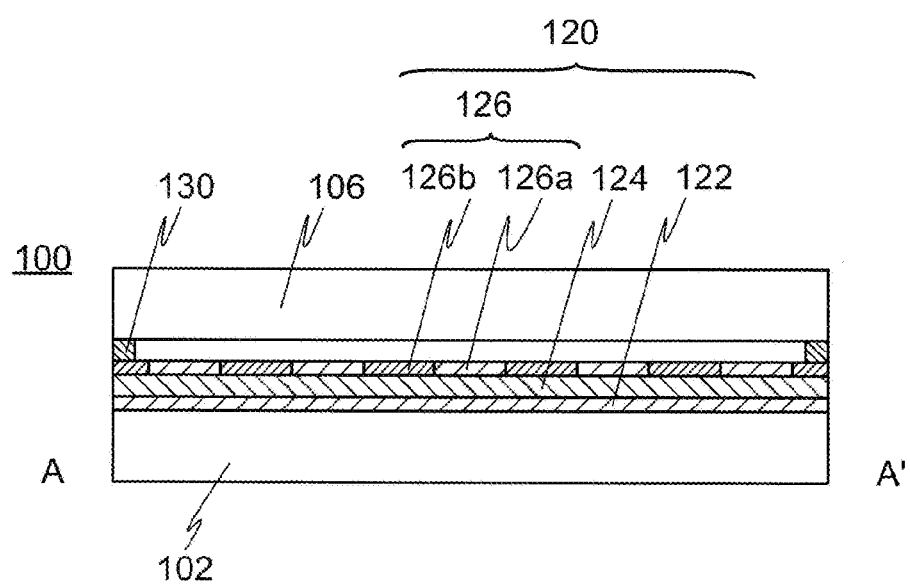
Figure 2B:
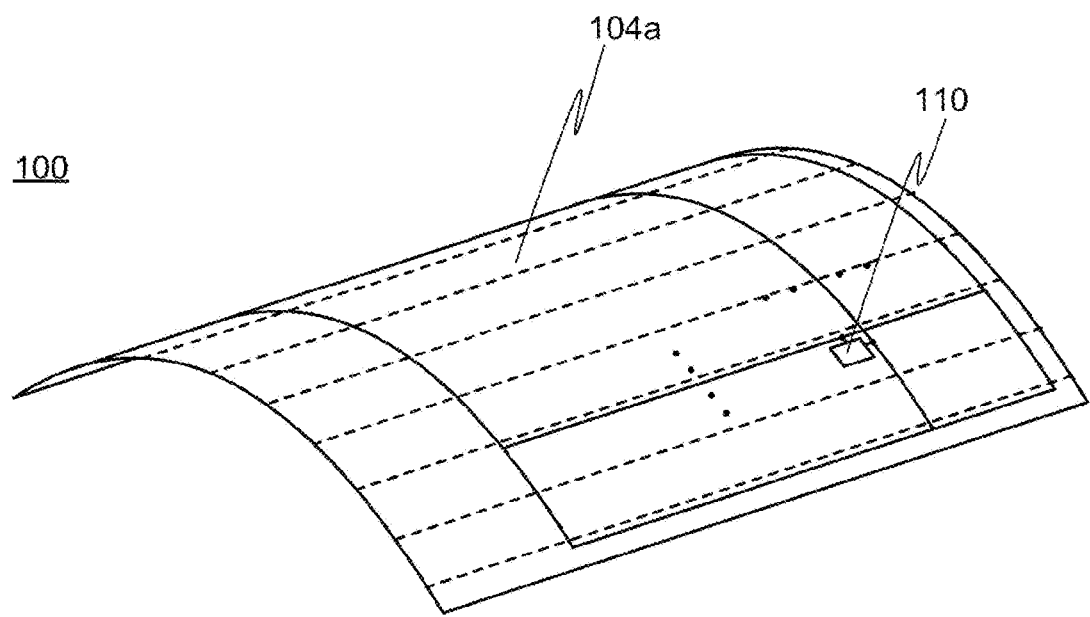
FIG. 2B is a planar view diagram and a cross-sectional diagram for explaining a bent state of a display device related to one embodiment of the present invention.
Figure 3:
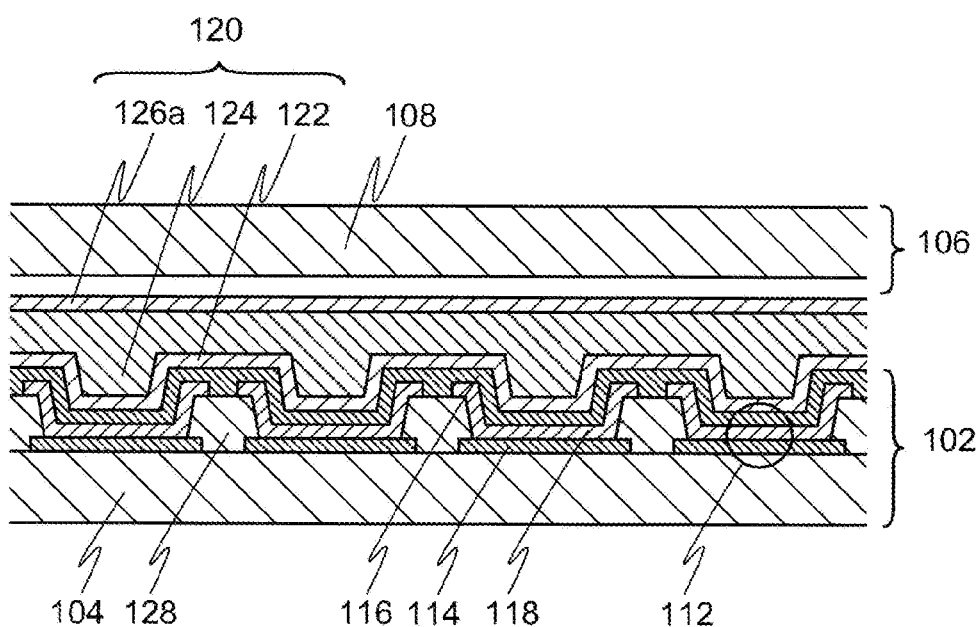
FIG. 3 is an expanded cross-sectional diagram for explaining a structure of a display device related to one embodiment of the present invention.
Figure 3:
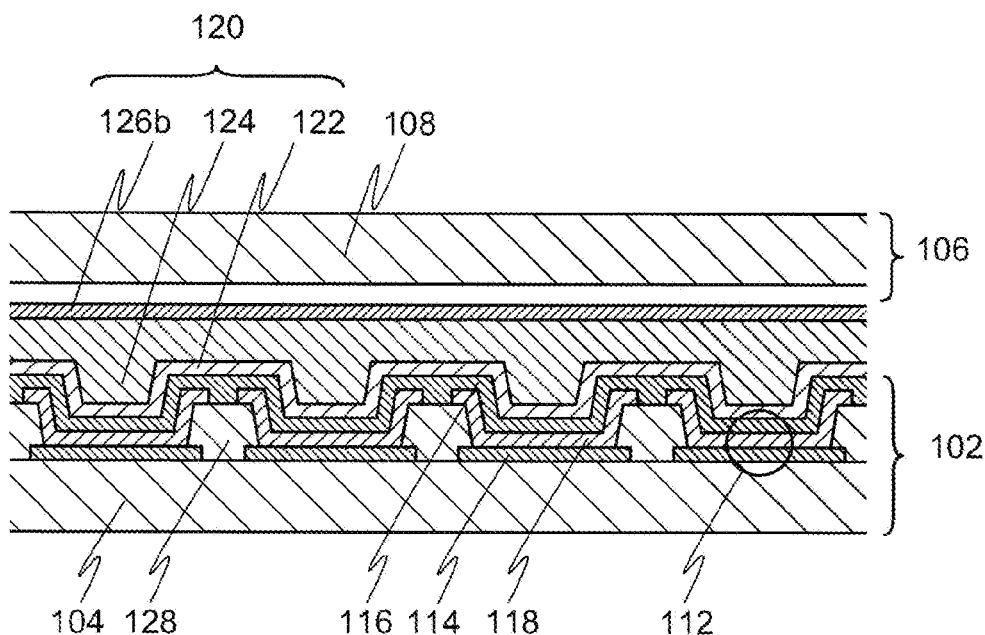

FIG. 2A is a planar view diagram and a cross-sectional diagram for explaining an approximate structure of a display device 100 related to the present embodiment. FIG. 2B is a perspective diagram for explaining the bent state of the display device 100 related to the present embodiment. FIG. 3 is an expanded cross-sectional diagram for explaining the structure of the display device 100 related to the present embodiment. Although described herein, a display region includes a low density region 126a and a high density region 126b. In FIG. 3, a cross-sectional diagram of a low density region 126a of the display device 100 is shown at the top and a cross-sectional diagram of a high density region 126b of the display device 100 is shown at the bottom.

The display device 100 related to the present embodiment is arranged with an array substrate 102 and a sealing layer 120.

The array substrate 102 includes the first substrate 104 and a plurality of pixels 110.

The first substrate 104 includes a display region 140a and a terminal region 140b. The first substrate 104 uses a substrate having flexibility in the present embodiment. A resin material is used as the substrate having flexibility. It is preferred that a high molecular material including an imide bond in repeating units is used as the resin material such as polyimide for example. Specifically, a film substrate in which polyimide is formed into a sheet shape is used as the first substrate 104. In this way, the entire array substrate 102 has flexibility.

Each of the plurality of pixels 110 is arranged in the display region 140a above the first substrate 104. Each of the plurality of pixels 110 is formed from a pixel circuit including at least a selection transistor (not shown in the diagram), a drive transistor (not shown in the diagram), and a light emitting element 112.

It is possible to use a self-light emitting type light emitting element as the light emitting element 112, for example it is possible to use an organic EL light emitting element. The organic EL light emitting element includes a pixel electrode 114, a common electrode 116 and a light emitting layer 118.

The pixel electrode 114 is arranged for each of the plurality of pixels 110. It is preferred to use a material including a metal layer with high reflectance as the material of the pixel electrode 114 in order to reflect light emitted by the light emitting layer 118 to the common electrode 116 side. It is possible to use silver (Ag) for example as the metal layer with high reflectance.

Furthermore, a transparent conductive layer may be stacked in addition to the metal layer with high reflectance described above. ITO (indium oxide added with tin) or IZO (indium zinc oxide) and the like which have translucency and conductivity are preferred to be used as the transparent conductive layer. In addition, an arbitrary combination of these may also be used.

The common electrode 116 in the present embodiment is arranged across a plurality of pixels 110. ITO (indium oxide added with tin) or IZO (indium zinc oxide) and the like which have translucency and conductivity are preferred to be used as the material of the common electrode 116 in order to allow light emitted by the light emitting layer 118 to pass through. Alternatively, a metal layer having a film thickness which can allow emitted light to pass though may also be used as the common electrode 116. Furthermore, a common electrode may also be individually formed for each pixel electrode.

The light emitting layer 118 is arranged held between a pixel electrode 114 and common electrode 116. An organic EL material which emits light when supplied with a current is used as the material of the light emitting layer 118. It is possible to use a low molecular or high molecular organic material as the organic EL material. In the case where a low molecular organic material is used, in addition to an organic material having light emitting properties, the light emitting layer 118 is formed including a hole injection layer or electron injection layer or a hole transport layer or electron transport layer in order to hold an organic material having light emitting properties.

A bank 128 is arranged between two adjacent pixels 110. The bank 128 is arranged to cover a periphery edge part of a common electrode 114.

It is preferred to use an insulation material as the material of the bank 128. It is possible to use an inorganic insulation material or an organic insulation material as the insulation material. It is possible to use silicon oxide, silicon nitride or a combination thereof for example as an inorganic insulation material. It is possible to use a polyimide resin, an acrylic resin or a combination thereof for example as an organic insulation material. An inorganic insulation material and organic insulation material may also be used in combination.

By arranging the bank 128 formed from an insulation material, it is possible to prevent a common electrode 116 and pixel electrode 114 from short circuiting at an end part of the pixel electrode 114. Furthermore, it is possible to securely insulate adjacent pixels 110.

The sealing layer 120 is arranged across the display region 140a covering a plurality of pixels 110.

In the present embodiment, the sealing layer 120 includes a first insulation layer 122, second insulation layer 124 and third insulation layer 126. These layers which form the sealing layer 120 are stacked from the bottom layer in the order first insulation layer 122, second insulation layer 124 and third insulation layer 126. These layers are explained in order from the bottom layer side.

The first insulation layer 122 is arranged on the lowest layer in the sealing layer 120. An insulation material with low moisture permeability is preferred as the material of the first insulation layer 122.

It is possible to use an inorganic insulation layer as a specific material of the first insulation layer 122. For example, it is possible to use a layer such as silicon oxide (SiOx), silicon nitride (SiNx), silicon oxynitride (SiOxNy), silicon nitride oxide (SiNxOy), aluminum oxide (AlOx), aluminum nitride (AlNx), aluminum oxynitride (AlOxNy) and aluminum nitride oxide (AlNxOy) and the like (x, y are arbitrary) as a specific material of an inorganic insulation layer. In addition, a structure in which these layers are stacked may be used. In the present embodiment, silicon nitride is used as the material of the first insulation layer 122.

The second insulation layer 124 is arranged above the first insulation layer 122. An insulation material which can flatten concave and convex parts caused by a plurality of light emitting elements 112 or banks 128 and the like arranged on a lower layer is preferred as the material of the second insulation layer 124. When such concave and convex parts exist, the covering properties of the first insulation layer 122 are no longer sufficient and it becomes easier for a transport path of water to the first insulation layer 122 to be produced.

It is possible to use an inorganic insulation layer or organic insulation layer as a specific material of the second insulation layer 124. It is possible to use the inorganic insulation layers mentioned above as the inorganic insulation layer. It is possible to use an acrylic resin or epoxy resin and the like for example as the organic insulation layer.

An acrylic resin is used as the material of the second insulation layer 124 in the present embodiment.

The third insulation layer 126 is arranged above the second insulation layer 124. An insulation material with low moisture permeability is preferred as the material of the third insulation layer 126. Although an acrylic resin is used as the second insulation layer 124 in the present embodiment, an organic insulation layer easily becomes an infiltration path for water. As a result, when water infiltrates the second insulation layer 124, there is concern that the water may reach the first insulation layer 122 and further infiltrate to the light emitting layer 118. Since the second insulation layer 124 using an acrylic resin has a high level of flatness, the third insulation layer 126 has excellent covering properties which makes it difficult for a transport path for water to be produced.

In the present embodiment, silicon nitride is used as the material of the third insulation layer 126.

The third insulation layer 126 further includes a density pattern. Here, a density pattern means a pattern including the low density region 126a and high density region 126b. This pattern may also be a cyclical pattern. The low density region 126a is a region in which the density of the third insulation layer 126 has a lower density than the average density of the third insulation layer 126 arranged across and within the display region. The high density region 126b is a region in which the density of the third insulation layer 126 has a higher density than the average density of the third insulation layer 126 arranged across and within the display region. Here, density may mean area volume density (in units of atoms/cm2) or may mean volume density (in units of atoms/cm3). The case where the contained amount of hydrogen changes in further included.

Furthermore, a density pattern is not limited to including a clear contrast in which a local density distribution within each region changes in a step shape in a boundary vicinity of the low density region 126a and high density region 126b. Therefore, a density pattern also includes the case where the density distribution changes linearly for example.

In the present embodiment, the contained amount of hydrogen of the third insulation layer 126 within the high density region 126b is 5 at % or more and 15 at % or less, and the contained amount of hydrogen within the low density region 126a is 30 at % or more.

In the present embodiment, the density pattern is a band shape in a vertical direction. The width of each of the low density region 126a and the high density region 126b is almost equal.

By adopting such a structure, the low density region 126a functions as an impact absorbing layer when the display device 100 is bent and it is possible to relieve stress applied to the high density region 126b. In this way, it is difficult for cracks to occur in the sealing layer 120 when the display device 100 is bent and it is possible to provide the display device 100 with improved reliability.

The width of each of the high density region 126b and low density region 126a may be determined based on the minimum curvature radius which is assumed when the display device 100 is bent. When the width of each of the high density region 126b and low density region 126a is large compared to the curvature radius described above, stress produced in the third insulation layer 126 when bent is not dispersed and the low density region 126a of the third insulation layer 126 no longer performs the role of an impact absorbing layer. As a result, resistance to cracks when bending cannot be improved.

Furthermore, in the present embodiment, a band shaped repeating pattern has a constant cycle as the density pattern. However, the density pattern is not limited thereto. As another example, in the case where a planar region in which bending is not assumed and a curved region where bending is assumed are stipulated within a display region, a density pattern may be arranged only in the curved region. As a further example, although a density pattern is arranged in both a curved region and a planar region, the cycle of a density pattern in a planar region with respect to the cycle of a density pattern in the curved region may be set to become larger as the distance increases from a boundary with the curved region.

According to the display device 100 related to the present embodiment, it is possible to provide the display device 100 with improved resistance to bending of the display device 100.

[Manufacturing Method]

Figure 4A:
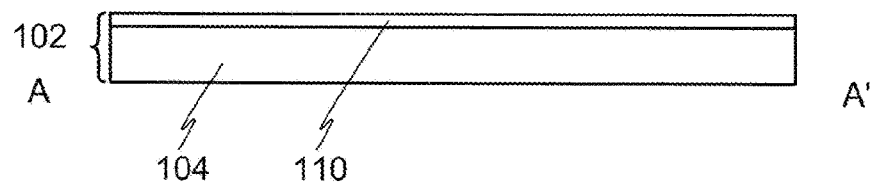
FIG. 4A is a cross-sectional diagram for explaining a manufacturing method of a display device related to one embodiment of the present invention.
Figure 4B:
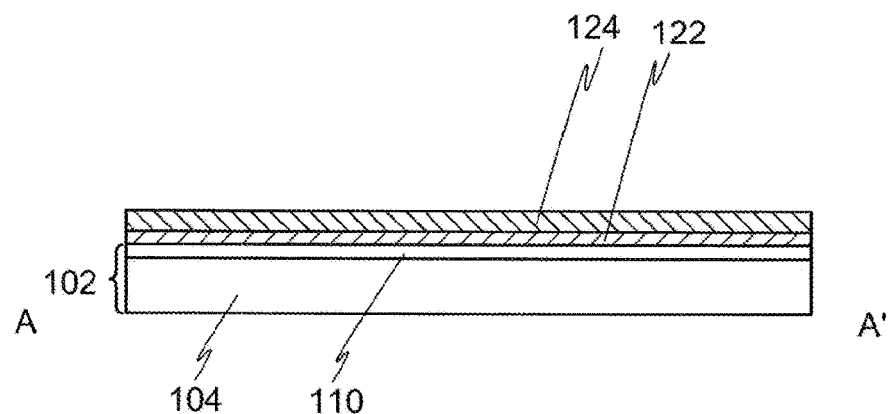
FIG. 4B is a cross-sectional diagram for explaining a manufacturing method of a display device related to one embodiment of the present invention.
Figure 4C:
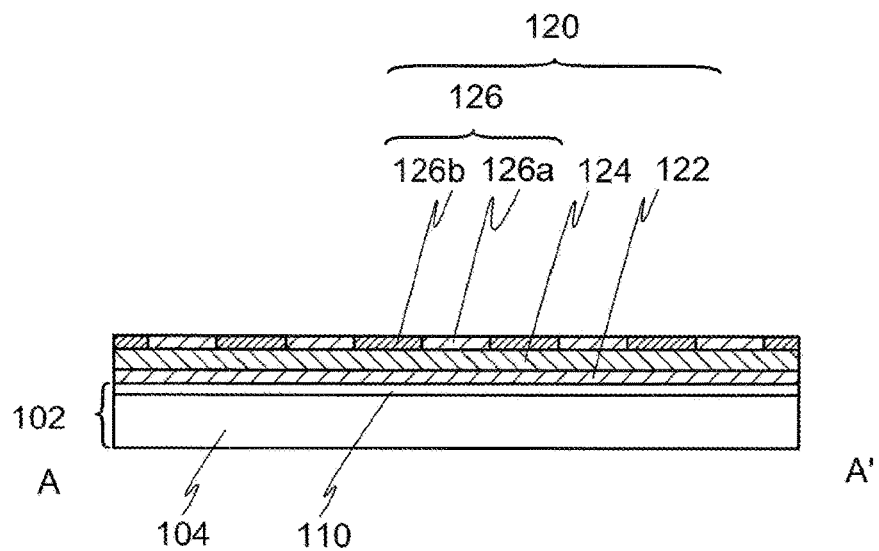
FIG. 4C is a cross-sectional diagram for explaining a manufacturing method of a display device related to one embodiment of the present invention.

FIG. 4A to FIG. 4C are cross-sectional diagrams for explaining a manufacturing method of the display device 100 related to the present embodiment. A manufacturing method of the display device 100 related to the present embodiment is explained in detail using FIG. 4A to FIG. 4C. The manufacturing method of the display device 100 related to the present embodiment includes the following processes.

First, an array substrate 102 arranged with a plurality of pixels 110 in the first substrate 104 is prepared (FIG. 4A).

The first substrate 104 is a substrate having flexibility formed by molding a polyimide resin and the like into a sheet shape above a support substrate made of a glass substrate and the like. As a result, the entire array substrate 102 includes flexibility. A plurality of pixels 110 is formed above the first substrate 104.

Next, the first insulation layer 122 and second insulation layer 124 are formed covering the plurality of pixels 110 (FIG. 4B). The material of the first insulation layer 122 is silicon nitride and it is possible to use a plasma CVD method or sputtering method as the film formation method. The second insulation layer 124 is an acrylic resin and it is possible to use a coating method or vapor deposition method as the film formation method.

Next, the third inorganic insulation layer 126 is formed having a density pattern including a low density region 126a and high density region 126b covering the plurality of pixels 110 (FIG. 4C). It is possible to use a roll coater 500 as the film formation apparatus of the third insulation layer. It is possible to use a plasma CVD method for example as the film formation method.

Figure 5:
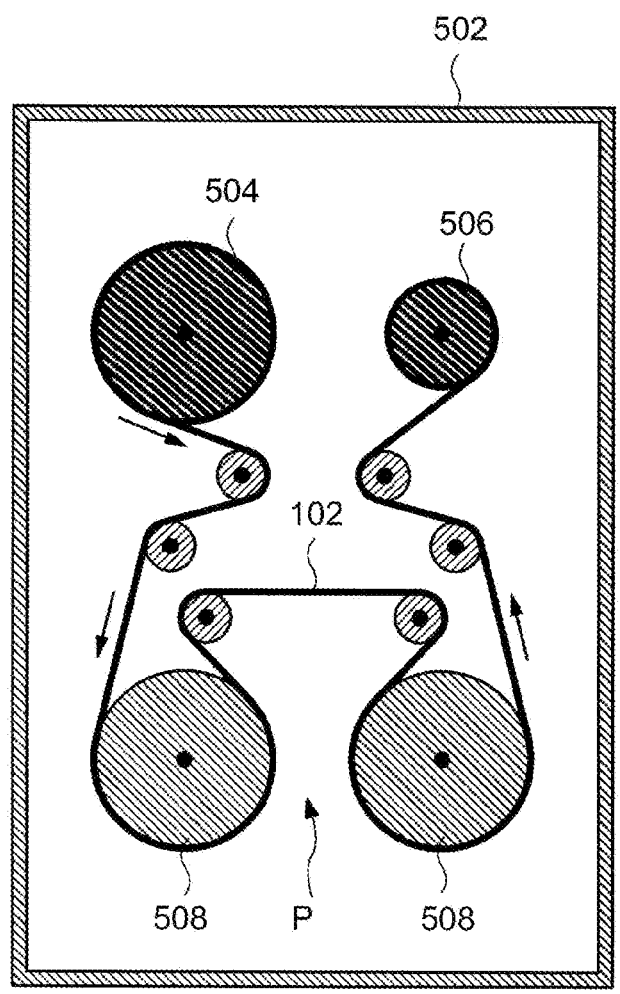
FIG. 5 is schematic diagram for explaining a structure of a film forming apparatus used in a method of manufacturing a display device related to one embodiment of the present invention.

FIG. 5 is a schematic diagram for explaining the structure of a roll coater 500 used in the manufacturing method of the display device 100 related to the present embodiment. The array substrate 102 having flexibility is transported to a winding roll 506 from a feed roll 504 within a film formation chamber 502. The array substrate 102 passes through two film formation rolls 508 between the feed roll 504 and winding roll 506. A plasma P is generated between the two film formation rolls 508 and film formation takes place. In this way, the array substrate 102 is transported and a film formation material is deposited in the vicinity of sections where the two film formation rolls 508 are closest. In this way, it is possible to deposit a film formation material across the film formation surface of the array substrate 102.

In order to obtain the third insulation layer 126 having the density pattern related to the present embodiment using the roll coater 500, the film formation conditions may be dynamically changed according to the transportation speed of the array substrate 102 and the cycle determined by a band gap included in a certain density pattern. The film formation conditions are, for example, film formation gas flow amount, film formation temperature and pressure and the like.

That is, the film formation conditions are switched between a time period in which a region corresponding to the low density pattern 126a is transported through the vicinity of a position where the two film formation rolls 508 are closest to each other, and a time period in which a region corresponding to the high density pattern 126b is transported through the vicinity of a position where the two film formation rolls 508 are closest to each other when transporting the array substrate 102. In this way, it is possible to obtain the third insulation layer 126 having a band shaped density pattern in the same direction as the rotation axis of the film formation roll 508.

Next, the array substrate 102 and opposing substrate 106 are bonded together and it is possible to obtain the display device 100 related to the present embodiment shown in FIG. 2A and FIG. 2B.

According to the manufacturing method of the display device 100 related to the present embodiment, it is possible to obtain the third insulation layer 126 having a band shaped density pattern in the same direction as the rotation axis of the film formation roll 508 included in a roll coater.

Modified Example

It is possible to form the third insulation layer 126 using a sputtering method instead of a plasma CVD method as a modified example of the manufacturing method of the display device 100 related to the present embodiment.

Figure 6:
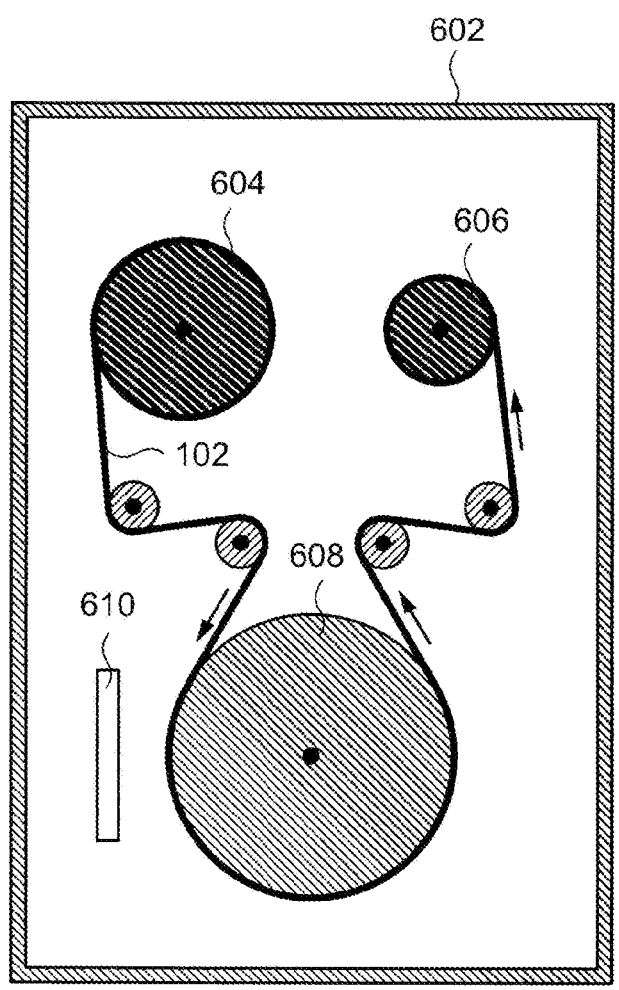
FIG. 6 is schematic diagram for explaining a structure of a film forming apparatus used in a modified example of a method of manufacturing a display device related to one embodiment of the present invention.

FIG. 6 is a schematic diagram for explaining the structure of a roll coater 600 used in a modified example of the manufacturing method of the display device 100 related to the present embodiment. The array substrate 102 having flexibility is transported to a winding roll 606 from a feed roll 604 within a film formation chamber 602. The array substrate 102 passes through two film formation rolls 608 between the feed roll 604 and winding roll 606. One direction of the film formation roll 608 is installed with a sputtering target 610. In this way, the array substrate 102 is transported and a film formation material is deposited in the vicinity of sections where the sputtering target 610 and film formation roll 608 are closest. In this way, it is possible to deposit a film formation material across the film formation surface of the array substrate 102.

In order to obtain the third insulation layer 126 having the density pattern related to the present embodiment using the roll coater 600, the film formation conditions may be dynamically changed according to the transportation speed of the array substrate 102 and the cycle determined by a band gap included in a certain density pattern. The film formation conditions are for example, film formation gas flow amount, film formation temperature and pressure and the like.

Second Embodiment

[Detailed Structure]

Figure 7:
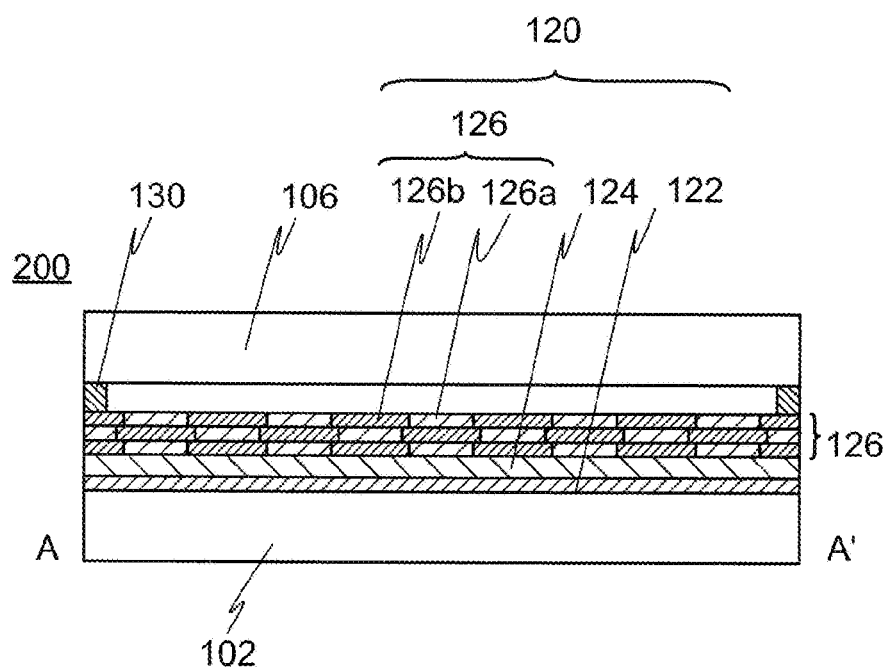
FIG. 7 is a cross-sectional diagram for explaining a structure of a display device related to one embodiment of the present invention.

FIG. 7 is a cross-sectional diagram for explaining an approximate structure of a display device 200 related to the present embodiment. The display device 200 related to the present embodiment is different compared to the display device 100 related to the first embodiment only in the structure of the third insulation layer 126 of the sealing layer 120 in particular.

The sealing layer 120 includes the first insulation layer 122 to the third insulation layer 126 and the third insulation layer 126 includes a plurality of insulation layers. In the third insulation layer 126, an insulation layer which includes a first density pattern and an insulation layer which includes a second density pattern are alternately stacked.

The second density pattern is an inverted pattern of the first density pattern. That is, in a plane structure, the high density region 126b in the second density pattern corresponds to the low density region 126a in the first density pattern, and the low density region 126a in the second density pattern corresponds to the high density region 126b in the first density pattern. In this way, in two adjacent insulation layers in a cross-sectional structure, the high density region 126b in one insulation layer is adjacent to the low density region 126a in the other insulation layer.

By adopting such a structure, at least one insulation layer arranged with a high density region 126b exists above an arbitrary section on a plane surface of the array substrate 102. In this way, a path in a film thickness direction within a path of water which can be produced in the sealing layer 120 is blocked since a high density region 126b exists in at least one layer.

In addition to the structure described above, it is further preferable that a structure is adopted in which a path in a plane direction is blocked within a path of water which can be produced in the sealing layer 120. In the present embodiment, a path of water from the exterior of the sealing layer 120 to the plurality of pixels 110 is blocked in both a film thickness direction and plane direction by a high density region 126b in at least the lowest insulation layer and a high density region 126b in an adjacent insulation layer thereupon.

In this way, moisture permeability of the sealing layer 120 as a whole drops. In other words, water prevention of the sealing layer 120 as a whole improves. In this way, it is possible to provide the display device 200 with improved reliability.

Furthermore, a form in which density patterns in a mutually inverted relationship are stacked was shown in the present embodiment. However, needless to say, the present embodiment is not limited to the structure of the sealing layer 120 described above in order to obtain the actions and effects described above.

According to the display device 200 related to the present embodiment, it is possible to provide the display device 200 with improved resistance to bending and improved water prevention.

Third Embodiment

[Detailed Structure]

Figure 8:
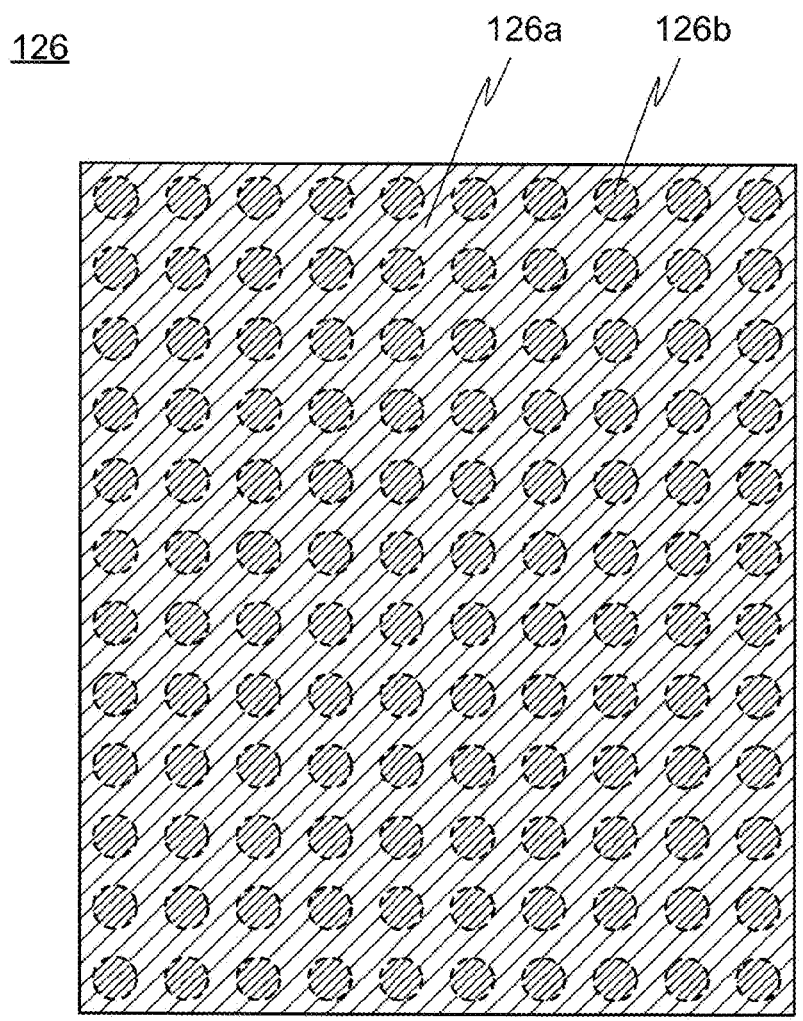
FIG. 8 is a planar view diagram for explaining a structure of a display device related to one embodiment of the present invention.

FIG. 8 is a planar view diagram for explaining an approximate structure of a display device 300 related to the present embodiment. The display device 300 related to the present embodiment is different compared to the display device 100 related to the first embodiment only in the density pattern. That is, in the display device 300 related to the present embodiment, a plurality of punctuated high density regions 126b is repeatedly arranged in a plane direction. That is, a plurality of punctuated high density regions 126b is arranged in a lattice shape in-plane.

In addition, although a density pattern has a limited repeating cycle in a horizontal direction in the display device 100 related to the first embodiment, the density pattern has translational symmetry in a vertical direction. In the display device 300 related to the present embodiment, a density pattern has a limited repeating cycle in a horizontal direction and a vertical direction and the cycles are equal in both directions.

By adopting such a structure, resistance to bending improves not only in a vertical direction and horizontal direction but also in other arbitrary directions.

Furthermore, in the present embodiment, a form in which a plurality of punctuated high density regions 126b is shown as being arranged in a lattice shape in-plane. However, the present invention is not limited to this form and various modifications are possible. For example, not only a punctuated shape but an arbitrary closed curve is also possible. In addition, not only a lattice shape but a plurality of high density regions 126b may also be arranged to have a repeating cycle with respect to two arbitrary directions having mutual angles.

According to the display device 300 related to the present embodiment, it is possible to provide the display device 300 with improved resistance to bending in an arbitrary direction.

[Manufacturing Method]

First, an array substrate 102 arranged with a plurality of pixels 110 in the first substrate 104 is prepared the same as in FIG. 4A.

Next, the same as in FIG. 4B, the first insulation layer 122 and second insulation layer 124 are formed.

Next, the third insulation layer 126 is formed above the array substrate 102. In the present embodiment, the array substrate 102 is disposed in a substrate support body. During film formation of the third insulation layer 126 having a density pattern, a body including a temperature gradient with a certain pattern is used as the substrate support body.

A certain pattern means a pattern based on a density pattern. Specifically, a temperature gradient is arranged so that in the substrate support body, the temperature of a region corresponding to a high density pattern 126b is lower than the temperature of a region corresponding to a low density pattern 126a. The layout of a heater arranged in the substrate support body may be adjusted for example in order to arrange a temperature gradient. A plasma CVD method can be used for example as the film formation method.

By arranging a temperature gradient in the substrate support body, a density pattern with different film densities is formed according to the temperature gradient in the third insulation layer 126 to be deposited even in the case where other film formation conditions (pressure, gas type, plasma conditions and the like) are the same. Since deposition speed increases the higher the temperature of a film formation surface of the array substrate 102, the density of a layer to be deposited can also increase. In addition, since the amount of contained hydrogen included in the third insulation layer 126 drops the higher the temperature of a film formation surface of the array substrate 102, the density of a layer to be deposited can also increase.

It is possible to form the third insulation layer 126 having a density pattern corresponding to a certain pattern above a plurality of pixels 110 in a state where this type of temperature gradient is arranged.

Next, the array substrate 102 and opposing substrate 106 are bonded together and it is possible to obtain the display device 300 related to the present embodiment.

According to the manufacturing method of the display device 300 related to the present embodiment, it is possible to obtain a third insulation layer 126 having an arbitrary density pattern.

Fourth Embodiment

[Detailed Structure]

Figure 9:
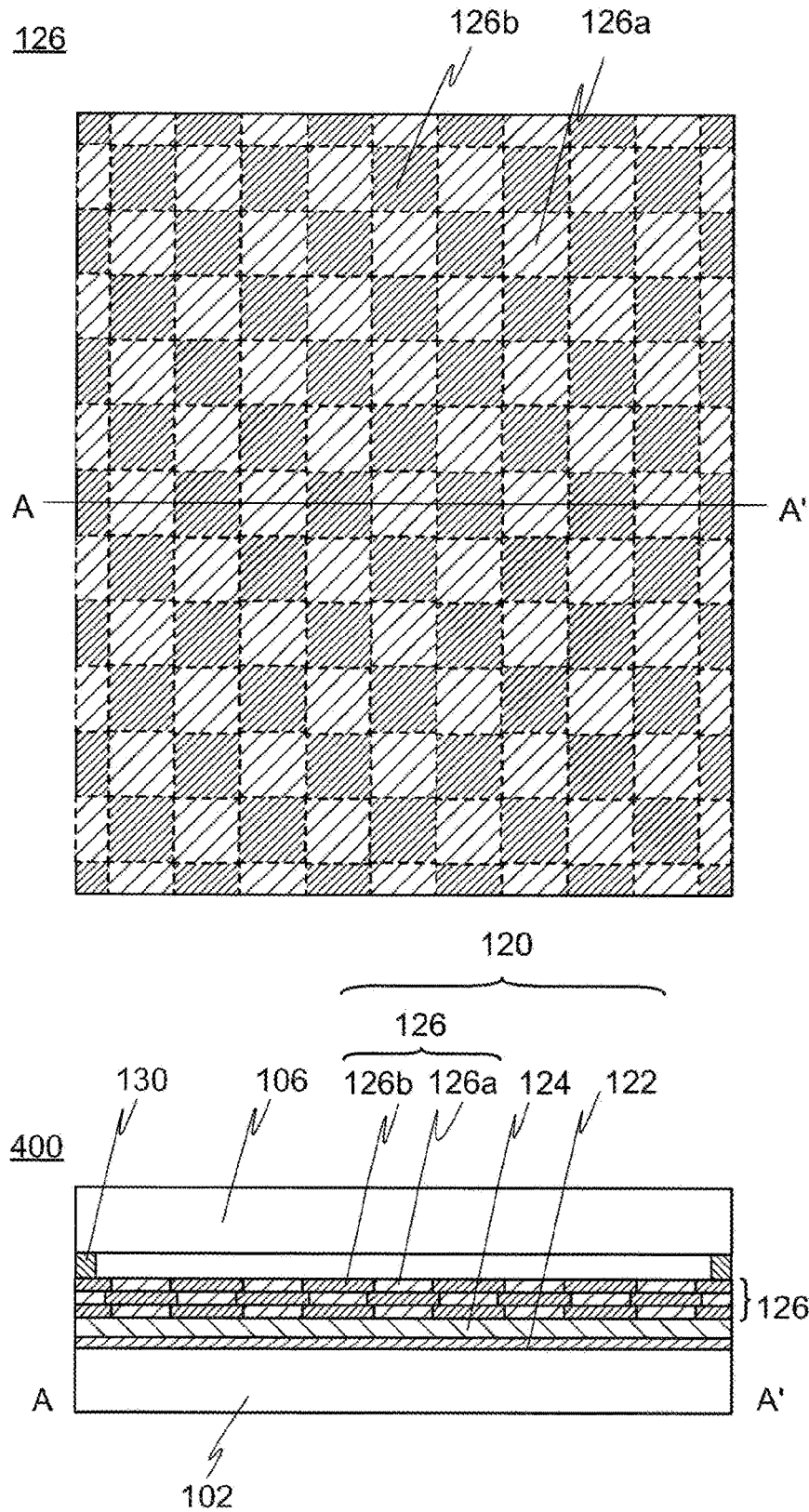
FIG. 9 is a planar view diagram and cross-sectional diagram for explaining a structure of a display device related to one embodiment of the present invention.

FIG. 9 is a planar view diagram and cross-sectional diagram for explaining an approximate structure of a display device 400 related to the present embodiment. The display device 400 related to the present embodiment is different compared to the display device 200 related to the second embodiment only in the density pattern. That is, in the display device 400 related to the present embodiment, a first density pattern is arranged with a plurality of high density regions 126b and low density regions 126a repeatedly in a lattice shape.

By adopting such a structure, moisture permeability of the sealing layer 120 as a whole drops. That is, water prevention of the sealing layer 120 as a whole improves. Furthermore, resistance to bending improves not only in a vertical direction and horizontal direction but also in other arbitrary directions.

According to the structure of the display device 400 related to the present embodiment, it is possible to provide the display device 400 with improved resistance to bending in an arbitrary direction and improved water prevention.

The preferred forms of the present invention were explained above. However, these are merely examples and the technical scope of the present invention is not limited to these forms. A person ordinarily skilled in the art could perform various modifications without departing from the concept of the present invention. Consequently, such modifications should naturally be interpreted as belonging to the technical scope of the present invention.

What is claimed is:

1. A display device comprising:
a display region arranged with a plurality of pixels;
a common electrode layer covering the display region; and
a sealing layer covering the common electrode layer;
wherein
the plurality of pixels are arranged along a first direction and a second direction intersecting the first direction;
the sealing layer includes at least a first insulation layer, a second insulation layer and a third insulation layer;
the first insulating layer, the second insulating layer and the third insulating layer are provided in this order from the side provided with the common electrode layer;
the third insulation layer includes a density pattern;
the density pattern includes a plurality of low density regions and a plurality of high density regions;
each of the plurality of low density regions is a sparse region and each of the plurality of high density regions is a dense region;
each of the plurality of low density regions has the third insulation layer with a lower density than an average density within the display region;
each of the plurality of high density regions has the third insulation layer with a higher density than an average density within the display region;
the plurality of low density regions is comprised of a region other than the plurality of high density regions in a plan view of the display region;
the plurality of high density regions and the plurality of low density regions are comprised of the same layer; and
both a surface of the plurality of high density regions on the common electrode layer side and a surface of the plurality of low density regions on the common electrode layer side are in direct contact on a surface opposite to a surface of the second insulating layer provided with the common electrode layer.

2. The display device according to claim 1, wherein both the plurality of high density regions and the plurality of low density regions are arranged along the first direction or the second direction.

3. The display device according to claim 2, wherein at least one of the plurality of high density regions and the plurality of low density regions have a limited repeating cycle in the arrangement direction of the first direction or the second direction.

4. The display device according to claim 2, wherein both the plurality of high density regions and the plurality of low density regions have a limited repeating cycle in the arrangement direction of the first direction and the second direction; and
the limited repeating cycles are substantially equal between the plurality of high density regions and the plurality of low density regions.

5. The display device according to claim 1, wherein at least one of the plurality of high density regions and the plurality of low density regions is a plurality of punctuated regions.

6. The display device according to claim 1, wherein a hydrogen content in the third insulation layer within the high density region is 5 at % or more and 15 at % or less and a hydrogen content in the third insulation layer within the low density region is 30 at % or more.

7. The display device according to claim 1, wherein the third insulation layer is a silicon nitride layer.

* * * * *